United States Patent
Jeong (10) Patent No.: US 8,379,460 B2
(45) Date of Patent: Feb. 19, 2013

(54) TRIM CIRCUIT AND SEMICONDUCTOR MEMORY DEVICE COMPRISING SAME

(75) Inventor: Jae-Yong Jeong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 301 days.

(21) Appl. No.: 12/912,001

(22) Filed: Oct. 26, 2010

(65) Prior Publication Data

US 2011/0110164 A1 May 12, 2011

(30) Foreign Application Priority Data

Nov. 9, 2009 (KR) .................. 10-2009-0107301

(51) Int. Cl.
*G11C 7/10* (2006.01)
(52) U.S. Cl. ............. 365/189.05; 365/201; 365/225.7; 365/230.08
(58) Field of Classification Search ............ 365/189.05, 365/201, 225.7, 230.08
See application file for complete search history.

(56) References Cited

U.S. PATENT DOCUMENTS

| 6,643,180 B2 * | 11/2003 | Ikehashi et al. ........... 365/185.22 |
| 6,665,226 B2 * | 12/2003 | Yoneya et al. ............. 365/225.7 |
| 6,909,642 B2 * | 6/2005 | Lehmann et al. ........ 365/189.09 |

FOREIGN PATENT DOCUMENTS

| JP | 2001357688 A | 12/2001 |
| JP | 2005277314 A | 10/2005 |
| KR | 1020080046493 A | 5/2008 |

* cited by examiner

*Primary Examiner* — Pho M Luu
*Assistant Examiner* — Thao Bui
(74) *Attorney, Agent, or Firm* — Volentine & Whitt, PLLC (57) ABSTRACT

A trim circuit comprises a trim code storage unit, a global latch unit and a local latch unit. The trim code storage unit stores a plurality of trim codes and outputs a sensing code in response to an address signal. The global latch unit latches a calibrated code or the sensing code to generate a global output signal. The calibrated code is generated by performing a calibration on the sensing code. The local latch unit repeatedly latches the global output signal in response to the address signal to generate a plurality of trim output signals.

20 Claims, 8 Drawing Sheets

TRIM CIRCUIT AND SEMICONDUCTOR MEMORY DEVICE COMPRISING SAME

CROSS-REFERENCE TO RELATED APPLICATIONS

This application claims priority under 35 USC §119 to Korean Patent Application No. 10-2009-0107301 filed on Nov. 9, 2009, the disclosure of which is hereby incorporated by reference in its entirety.

BACKGROUND

Embodiments of the inventive concept relate generally to electronic memory technologies. More particularly, embodiments of the inventive concept relate to trim circuits for memory devices, and memory devices and memory test systems incorporating the trim circuits.

Semiconductor manufacturing processes have variations that can cause minor differences in manufactured semiconductor devices. These differences can cause the semiconductor devices to have operating characteristics that differ from those intended by a designer. As examples, minor variations in layer deposition or curing processes can cause certain layers of a semiconductor memory device to have higher or lower resistances than intended, which can cause the operating voltages of the device to be slightly different from intended operating voltages.

To address the effects of manufacturing variances and other sources of device variation, semiconductor memory devices commonly include elements for adjusting certain operating characteristics following manufacture. As an example, many semiconductor memory devices incorporate a trim circuit, which can be used to adjust a device's operating voltages following manufacture.

One type of trim circuit comprises a fuse-programmable resistive network in which fuses are selectively programmed to various states to adjust operating voltages such as read and program voltages of a semiconductor memory device. The programming of a trim circuit can be performed in accordance with trim codes, which comprise information corresponding to different adjustment values.

A trim circuit is typically programmed by calibrating trim codes during a test operation. The test operation is typically performed by a test apparatus and can be performed, for instance, at a wafer level or a package level.

In a conventional test operation, the test apparatus reads trim codes from a device under test (DUT). The test apparatus then applies various signals to the DUT according to the trim codes and calibrates the trim codes according to the DUT's responses to the signals. The different trim codes can correspond to different operating modes of the DUT. Accordingly the different trim codes can be calibrated according to the different operating modes. Following the test operation, the calibrated trim codes are programmed into the DUT.

SUMMARY

Embodiments of the inventive concept provide trim circuits in which trim codes are calibrated more efficiently than in conventional trim circuits. Embodiments of the inventive concept also provide memory devices capable of adaptively controlling peripheral circuits under various operation modes and conditions using the trim circuit. Embodiments of the inventive concept also provide test systems capable of performing parallel tests on a plurality of devices each comprising a trim circuit.

According to an embodiment of the inventive concept, a trim circuit comprises a trim code storage unit configured to store a plurality of trim codes and to output at least one of the trim codes as a sensing code in response to an address signal, a global latch unit configured to latch a calibrated code or the sensing code and to output the latched code as a global output signal, the calibrated code being generated by performing a calibration on the sensing code, and a local latch unit configured to repeatedly latch the global output signal in response to the address signal to generate a plurality of trim output signals.

In certain embodiments, the trim circuit further comprises a calculator configured to perform a calculation on the sensing code and an input code to generate the calibrated code, the input code indicating a value for calibrating the sensing code.

In certain embodiments, the global latch unit sequentially performs a first latch operation and a second latch operation to generate each of the trim output signals such that the global latch unit latches the sensing code and outputs the latched sensing code as the global output signal during the first latch operation and the global latch unit selectively latches the sensing code or the calibrated code and outputs the latched code as the global output signal during the second latch operation.

In certain embodiments, the calculator receives the latched sensing code as the global output signal as a result of the first latch operation of the global latch unit.

In certain embodiments, the local latch unit latches the global output signal as a result of the second latch operation of the global latch unit.

In certain embodiments, the global latch unit comprises a selection unit configured to selectively output the sensing code or the calibrated code as an output signal in response to a calibration enable signal, and a global latch circuit configured to latch the output signal of the selection unit in response to a first latch signal and configured to output the latched output signal as the global output signal.

In certain embodiments, the global latch unit sequentially performs a first latch operation and a second latch operation to generate each of the trim output signals such that the global latch unit latches the sensing code and outputs the latched sensing code as the global output signal during the first latch operation and the global latch unit selectively latches the sensing code or the calibrated code and outputs the latched code as the global output signal during the second latch operation In certain embodiments, the first latch signal comprises a first pulse and a second pulse that are sequentially activated, wherein the first latch operation is performed in synchronization with the first pulse and the second latch operation is performed in synchronization with the second pulse.

In certain embodiments, the calibration enable signal is deactivated during the first latch operation, and the calibration enable signal is selectively activated or deactivated during the second latch operation.

In certain embodiments, the selection unit comprises a plurality of multiplexers that receive respective bits of the sensing code and respective bits of the calibrated code, and the global latch circuit comprises a plurality of latches each latching an output signal of a corresponding one of the multiplexers to generate a bit of the global output signal.

In certain embodiments, the local latch unit comprises a plurality of output units configured to sequentially latch the global output signal to generate the respective trim output signals.

In certain embodiments, each of the output units comprises a local latch circuit configured to latch the global output signal in response to a second latch signal to generate the trim output signals, and a local decoder configured to control a latch operation of the local latch circuit in response to the address signal.

In certain embodiments, the local latch circuit comprises a plurality of latches configured to latch respective bits of the global output signal.

In certain embodiments, the trim code storage unit comprises a fuse array comprising flash memory cells.

According to one embodiment of the inventive concept, a memory device comprises a memory core configured to store data, a trim code storage unit configured to store a plurality of trim codes and to output at least one of the trim codes as a sensing code in response to an address signal, a global latch unit configured to latch a calibrated code or the sensing code to generate a global output signal, the calibrated code being generated by performing a calibration on the sensing code, a local latch unit configured to repeatedly latch the global output signal in response to the address signal to generate a plurality of trim output signals, a peripheral circuit configured to generate at least one operating voltage and at least one clock signal for driving the memory core and further configured to control at least one of the clock signal and the operating voltage based on the trim output signals, and a controller configured to control the memory core.

In certain embodiments, the memory device further comprises a calculator configured to perform a calculation on the sensing code and an input code to generate the calibration code, the input code indicating a value for calibrating the sensing code.

In certain embodiments, the memory device further comprises a calibrator configured to generate a first input code for calibrating the sensing code according to an operating mode or operating condition of the memory device.

In certain embodiments, the memory device further comprises a multiplexer configured to selectively output the first input code or a second input code to the calculator, the second input code being received from an external source.

In certain embodiments, the memory core is a flash memory core, and the peripheral circuit comprises at least one voltage regulator configured to pump a power supply voltage to generate operating voltages of the memory core and configured to trim the operating voltages based on the trim output signals.

According to one embodiment of the inventive concept, a test system comprises a plurality of devices under test, and a tester configured to perform parallel tests on the devices under test. Each of the devices under test comprises a trim code storage unit configured to store a plurality of trim codes and configured to output one or more of the trim codes as a sensing code in response to an address signal, a global latch unit configured to latch a calibrated code or the sensing code to generate a global output signal, the calibrated code being generated by performing a calibration on the sensing code, a local latch unit configured to repeatedly latch the global output signal in response to the address signal to generate a plurality of trim output signals, and a peripheral circuit configured to generate at least one operating voltage and at least one clock signal for driving the memory core, and configured to control at least one of the clock signal and the operating voltage based on the trim output signals.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, the terms first, second, third, etc. are used to describe various elements; however, the described elements should not be limited by these terms. Rather, these terms are used merely to distinguish one element from another. Thus, a first element could be termed a second element, and so on. As used herein, the term "and/or" indicates any and all combinations of one or more of an accompanying list of items.

Where an element is referred to as being "connected" or "coupled" to another element, it can be directly connected or coupled to the other element or intervening elements may be present. In contrast, where an element is referred to as being "directly connected" or "directly coupled" to another element, there are no intervening elements present. Other words used to describe the relationship between elements should be interpreted in a similar fashion (e.g., "between" versus "directly between," "adjacent" versus "directly adjacent," etc.).

The terminology used herein is for the purpose of describing example embodiments only and is not intended to be limiting of the inventive concept. As used herein, the singular forms "a," "an" and "the" are intended to include the plural forms as well, unless the context clearly indicates otherwise. The terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. Terms, such as those defined in commonly used dictionaries, should be interpreted as having a meaning that is consistent with their meaning in the context of the relevant art and will not be interpreted in an idealized or overly formal sense unless expressly so defined herein.

Figure 1:
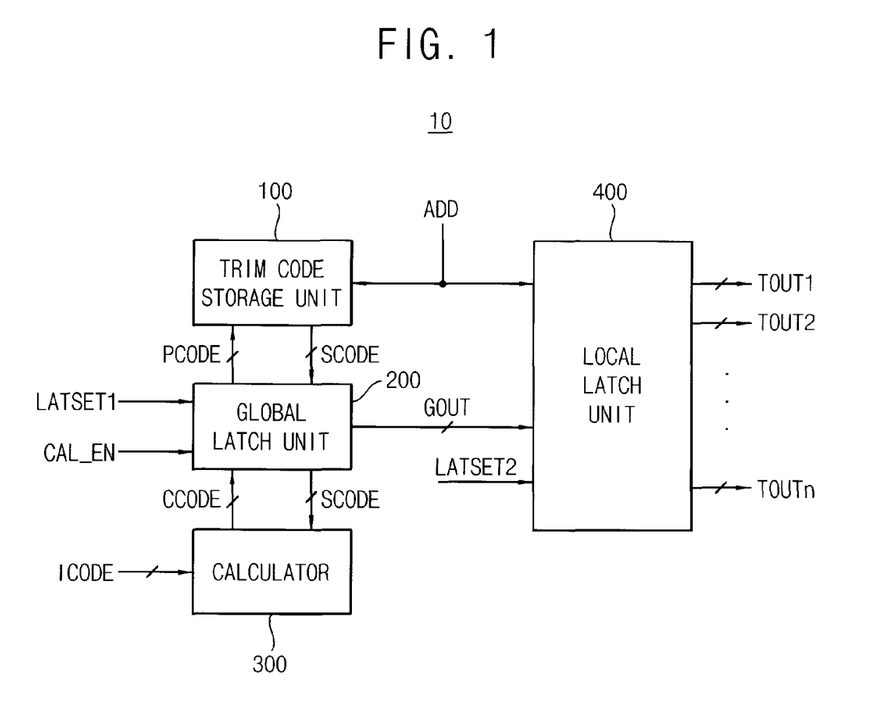
FIG. 1 is a block diagram illustrating a trim circuit according to an embodiment of the inventive concept.

FIG. 1 is a block diagram of a trim circuit 10 according to an embodiment of the inventive concept.

Referring to FIG. 1, trim circuit 10 comprises a trim code storage unit 100, a global latch unit 200, a calculator 300, and a local latch unit 400.

Trim code storage unit 100 stores a plurality of trim codes. Each trim code is programmed in trim code storage unit 100 based on a program code PCODE generated during a test operation of a semiconductor device. Trim code storage unit 100 outputs a sensing code SCODE in response to an address signal ADD. Sensing code SCODE is a trim code that is stored in trim code storage unit 100 at an address corresponding to address signal ADD. Address signal ADD is typically provided from an external source such as a tester, a memory controller, or an address buffer in the semiconductor device.

Global latch unit 200 latches a calibrated code CCODE or sensing code SCODE to generate a global output signal GOUT. Calibrated code CCODE is generated by performing a calibration on sensing code SCODE. Where a calibration enable signal CAL_EN has a first logic level (e.g., a logic low level), global latch unit 200 outputs sensing code SCODE as global signal GOUT, and where calibration enable signal CAL_EN has a second logic level (e.g., a logic high level), global latch unit 200 outputs calibrated code CCODE as global signal GOUT.

Local latch unit 400 latches global output signal GOUT in response to address signal ADD and generates a plurality of trim output signals TOUT1 through TOUTn based on global output signal GOUT. Trim output signals TOUT1 through TOUTn correspond to trim codes stored in trim code storage unit 100 according to address signal ADD. Each of trim output signals TOUT1 through TOUTn corresponds to sensing code SCODE or calibrated code CCODE.

Because global latch 200 is shared for calibrating a plurality of trim codes, trim circuit 10 makes relatively efficient use of device area and can improve the integration density of a semiconductor memory device incorporating trim circuit 10.

Calculator 300 performs a calculation on sensing code SCODE and an input code ICODE to generate calibrated code CCODE. Input code ICODE indicates a value for calibrating sensing code SCODE. For instance, input code ICODE can be a code for calibrating sensing code SCODE according to certain operation modes or operating conditions of a semiconductor device comprising trim code 10. Calculator 300 typically comprises an adding unit or a subtracting unit and generates calibrated code CCODE by performing addition or subtraction on sensing code SCODE and input code ICODE. Input code ICODE, as will be described below, can be provided from a tester during test process or from a calibrator in a memory device.

Global latch unit 200 sequentially performs a first latch operation and a second latch operation to generate trim output signals TOUTj (j is a natural number between 1 and n) associated with calibrated code CCODE. In the first latch operation, global latch unit 200 receives sensing code SCODE from trim code storage unit 100, latches sensing code SCODE and outputs the latched sensing code as global output signal GOUT. In the second latch operation, global latch unit 200 selectively latches sensing code SCODE or calibrated code CCODE and outputs the latched code as global output signal GOUT. In the second latch operation, calculator 300 calculates calibrated code CCODE based on global output signal GOUT produced in the first latch operation.

Local latch unit 400 performs a third latch operation to generate trim output signals TOUTj by latching global output signal GOUT that is generated as a result of the second latch operation. Global latch unit 200 performs the first and second latch operations in response to a first latch signal LATSET1 and local latch unit 400 performs the third latch operation in response to a second latch signal LATSET2. The activation timing of first latch signal LATSET1 and second latch signal LATSET2 can be controlled so that local latch unit 400 performs the third latch operation after the first and second latch operations are performed by global latch unit 200. The activation timing of first latch signal LATSET1 and second latch signal LATSET2 will be described below with reference to FIGS. 6, 7 and 8.

In the embodiment of FIG. 1, trim circuit 10 can be used to calibrate a semiconductor device for various operation modes and/or conditions by calibrating output codes of trim code storage unit 100 (i.e., sensing code SCODE) without changing the trim codes stored in trim code storage unit 100.

Figure 2:
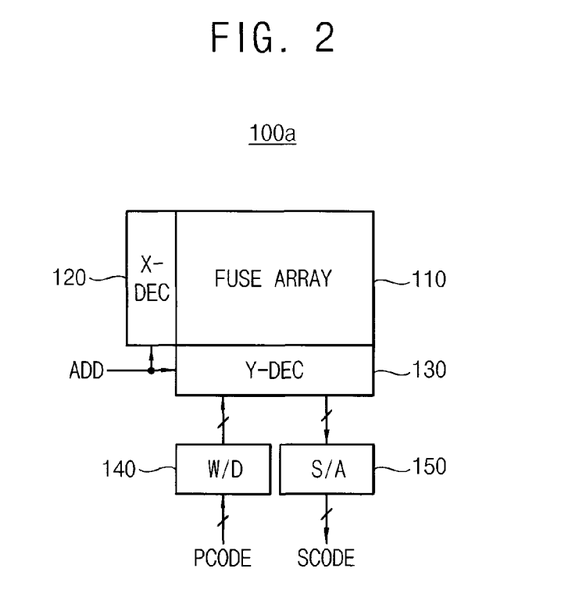
FIG. 2 is a block diagram illustrating an embodiment of a trim code storage unit in the trim circuit of FIG. 1.

FIG. 2 is a block diagram illustrating an embodiment of a trim code storage unit in the trim circuit of FIG. 1.

Referring to FIG. 2, a trim code storage unit 100a comprises a fuse array 110, a row decoder (X-DEC) 120, a column decoder (Y-DEC) 130, a write driver (W/D) 140, and a sense amplifier (S/A) 150.

Fuse array 110 comprises a plurality of fuse cells connected to respective wordlines and respective bitlines and arranged in a matrix of rows and columns. In some embodiments, fuse array 110 comprises a distinct element that is physically or electrically separated from a memory cell array of a memory device.

Row decoder 120 and column decoder 130 decode address signal ADD and select a wordline and a bitline based on address signal ADD. The selected wordline and bitline are used to write a trim code into fuse array 110 or to read a trim code from fuse array 110. Write driver 140 provides a program code PCODE to the corresponding bitline to write the trim code into trim code storage unit 100. Sense amplifier 150 detects or senses the trim code that is read from trim code storage unit 100 and outputs the detected trim code as sensing code SCODE. Writing drive 140 receives program code PCODE from an external device directly or via global latch unit 200.

The fuse cells of fuse array 110 typically comprise electrical fuses, anti-fuses, or laser fuses. The laser fuses can be programmed using laser cutting, and the electrical fuses and anti-fuses can be programmed using electrical signals. In some embodiments, such as an embodiment described with reference to FIG. 3, the fuse cells comprise flash cells.

Figure 3:
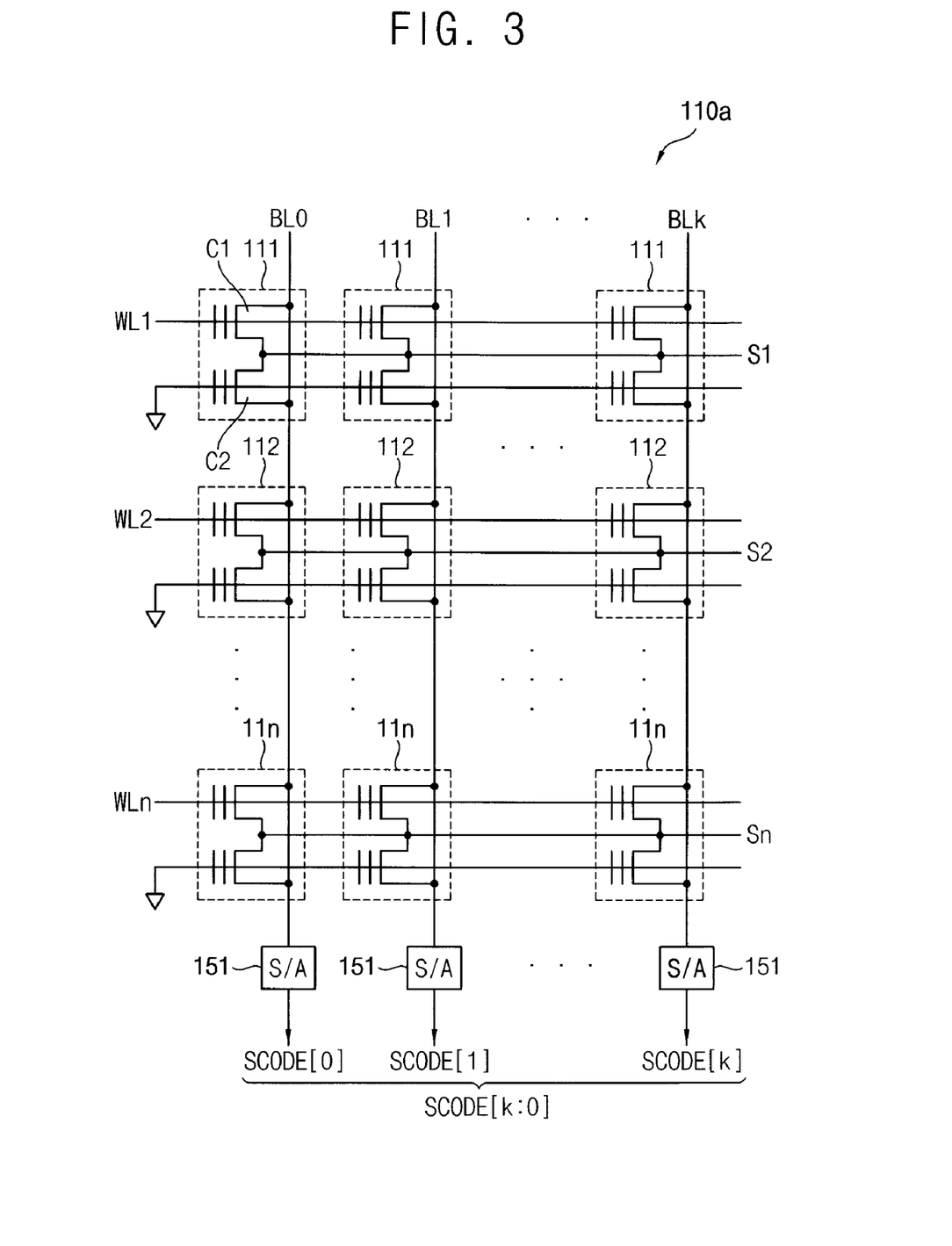
FIG. 3 is a circuit diagram illustrating an embodiment of a fuse array in the trim code storage unit of FIG. 2.

FIG. 3 is a circuit diagram illustrating an embodiment of a fuse array in the trim code storage unit of FIG. 2.

Referring to FIG. 3, a fuse array 110a comprises a plurality of fuse cells 111 through 11n, which are connected to respective wordlines WL1 through WLn and respective bitlines BL1 through BLk. Fuse cells 111 through 11n are arranged in a matrix of rows and columns. Fuse cells 111 through 11n comprise flash memory cells and can be formed using the same manufacturing processes as other flash memory devices. Each of fuse cells 111 through 11n comprises a code cell C1 and a dummy cell C2, where code cell C1 stores a bit of a trim code. Each code cell C1 is connected between a corresponding one of bitlines BL1 through BLk and a corresponding one of source lines S1 through Sn. A control gate of each code cell C1 is connected to a corresponding one of wordlines WL1 through WLn. As indicated by the ground symbol in FIG. 3, a turn-off voltage is applied to each dummy cell C2 through a control gate so that dummy cells C2 are deactivated. In some embodiments, dummy cells C2 are omitted from fuse array 110.

Fuse cells 111 through 11n store trim codes that are generated for various purposes. Where first wordline WL1 is selected based on address signal ADD, a corresponding trim code stored in fuse cells 111 is output through sense amplifiers (S/A) 151 as sensing code SCODE[k:0]. Local latch unit 400 generates first trim output signal TOUT1 by performing the third latch operation on sensing code SCODE[k:0]. Each of fuse cells 111 through 11n stores a bit of the trim code or sensing code SCODE[k:0], where sensing code SCODE[k:0] comprises a plurality of bits SCODE[0] through SCODE[k]. Similarly, second trim output signal TOUT2 is generated where second wordline WL2 is selected based on address signal ADD, and thus the plurality of trim output signals TOUT1 through TOUTn are generated sequentially by changing address signal ADD so that the wordlines are selected sequentially.

Figure 4:
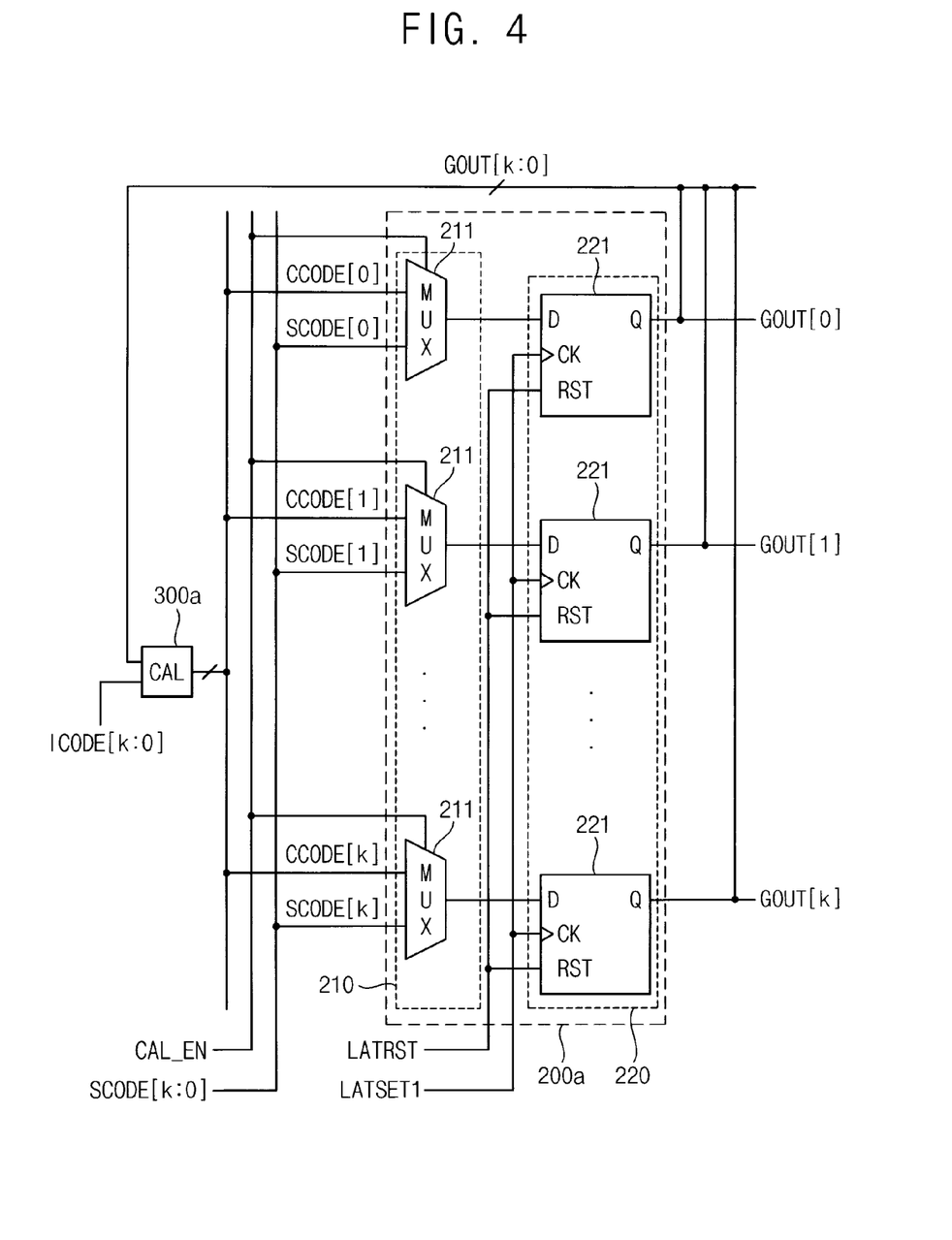
FIG. 4 is a diagram illustrating an embodiment of a calculator and a global latch unit in the trim circuit of FIG. 1.

FIG. 4 is a diagram illustrating an embodiment of a calculator and a global latch unit in the trim circuit of FIG. 1.

Referring to FIG. 4, a global latch unit 200a comprises a selection unit 210 and a global latch circuit 220.

Selection unit 210 selectively outputs sensing code SCODE[k:0] or calibrated code CCODE[k:0] in response to a calibration enable signal CAL_EN. Global latch circuit 220 latches an output signal of selection unit 210 in response to first latch signal LATSET1 and outputs the latched output signal as global output signal GOUT[k:0].

Global latch circuit 220 sequentially performs a first latch operation and a second latch operation to generate a first trim output signal TOUT[k:0] of trim output signals TOUTj (j is a natural number between 1 and n). During the first latch operation, global latch circuit 200 receives sensing code SCODE[k:0] from trim code storage unit 100, latches sensing code SCODE[k:0] and outputs the latched sensing code as global output signal GOUT[k:0]. Global latch circuit 220 receives sensing code SCODE[k:0] or calibrated code CCODE[k:0] from selection unit 210. During the second latch operation, global latch circuit 220 selectively latches sensing code SCODE[k:0] or calibrated code CCODE[k:0] and outputs the latched code as global output signal GOUT[k:0]. As will be described with reference to FIGS. 6 and 8, first latch signal LATSET1 comprises a first pulse P1 and a second pulse P2 that are sequentially activated. The first latch operation is performed in synchronization with first pulse P1, and the second latch operation is performed in synchronization with second pulse P2.

Calibration enable signal CAL_EN is deactivated during the first latch operation and calibration enable signal CAL_EN is selectively activated or deactivated during the second latch operation. In some embodiments, selection unit 210 outputs sensing code SCODE[k:0] during the first latch operation, and selectively outputs sensing code SCODE[k:0] or calibrated code CCODE[k:0] in response to calibration enable signal CAL_EN.

Selection unit 210 comprises a plurality of multiplexers (MUX) 211 that receive respective bits SCODE[0] through SCODE[k] of sensing code SCODE[k:0] and respective bits CCODE[0] through CCODE[k] of calibrated code CCODE[k:0]. Global latch circuit 220 comprises a plurality of latches 221. Latches 221 latch respective output signals multiplexers 211 and provide bits GOUT[0] through GOUT[k] of global output signal GOUT[k:0]. For example, each of latches 221 can be a flip-flop.

Each of multiplexers 211 outputs one bit that is selected between a bit SCODE[i] (i is a natural number between 0 and k) of sensing code SCODE[k:0] and a bit CCODE[i] of calibrated code CCODE[k:0] in response to calibration enable signal CAL_EN. Each of latches 221 receives an output signal of the corresponding one of multiplexers 211 through a data input node D and receives first latch signal LATSET1 through a clock node CK. Each of latches 221 provides a corresponding bit GOUT[i] of global output signal GOUT[k:0] through an output node Q. Additionally, latches 221 are reset in response to a reset signal LATRST that is provided through a reset node RST.

Global latch circuit 220 sequentially performs a first latch operation and a second latch operation to provide one trim output signal TOUT[k:0] of trim output signals TOUTj (j is a natural number between 1 and n). During the first latch operation, global latch circuit 200 receives sensing code SCODE[k:0] from trim code storage unit 100, latches sensing code SCODE[k:0] and outputs the latched sensing code as global output signal GOUT[k:0]. Global latch circuit 220 receives sensing code SCODE[k:0] or calibrated code CCODE[k:0] from selection unit 210. During the second latch operation, global latch circuit 220 selectively latches sensing code SCODE[k:0] or calibrated code CCODE[k:0] and outputs the latched code as global output signal GOUT[k:0]. Output nodes Q of latches 221 are connected to input nodes of a calculator (CAL) 300a, as illustrated in FIG. 4, so that calculator 300a receives sensing code SCODE[k:0] through global output signal GOUT[k:0] generated during the first latch operation. In some embodiments, second latch signal LATSET2 is activated only after the first and second latch operations of global latch unit 200 are performed.

Figure 5:
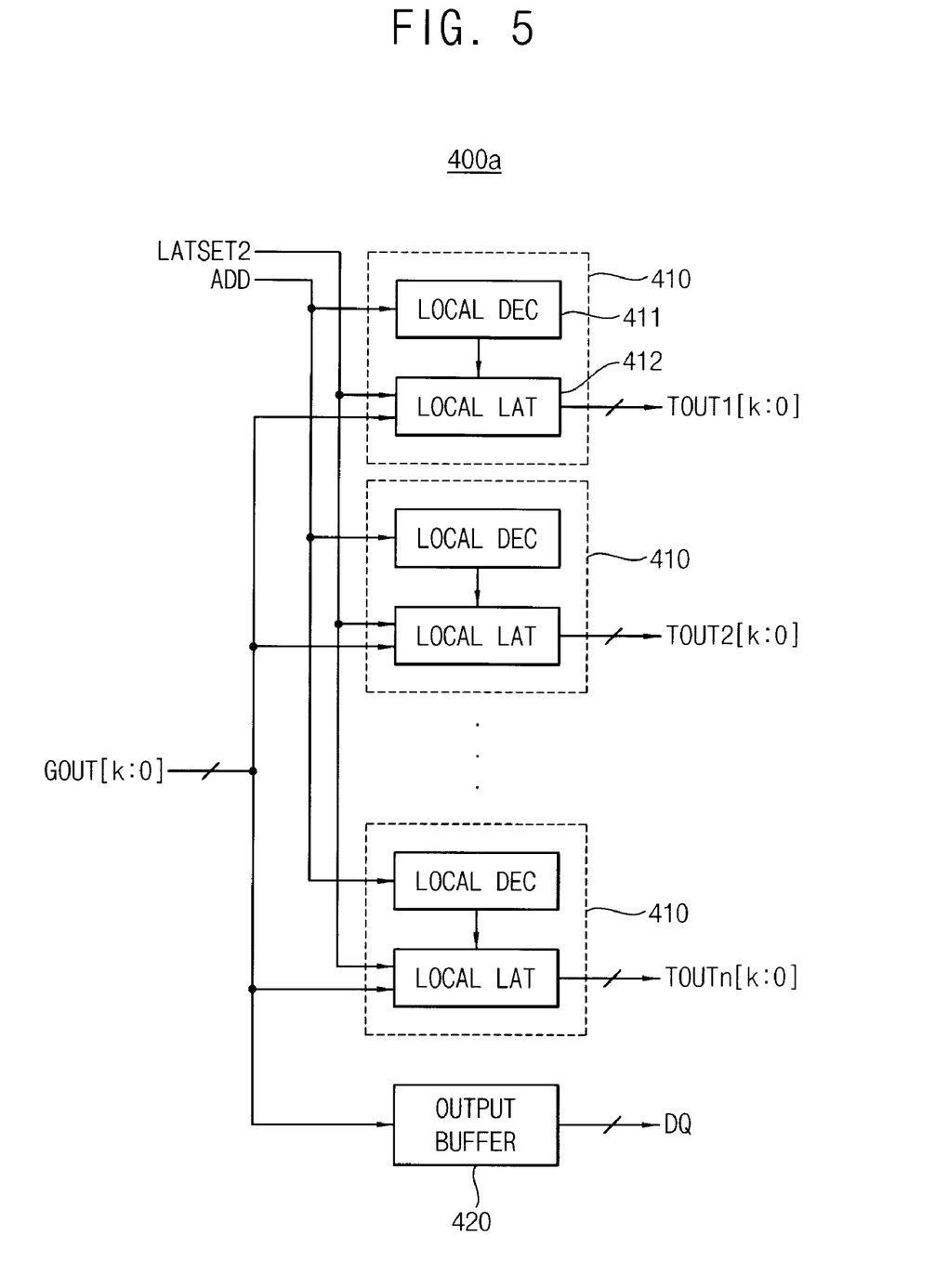
FIG. 5 is a diagram illustrating an embodiment of a local latch unit in the trim circuit of FIG. 1.

FIG. 5 is a diagram illustrating an embodiment of a local latch unit in the trim circuit of FIG. 1.

Referring to FIG. 5, a local latch unit 400a comprises a plurality of output units 410 that sequentially latch global output signal GOUT[k:0] to generate trim output signals TOUT1[k:0] through TOUTn[k:0]. Each of trim output signals TOUTj[k:0] (j is a nature number between 1 and n) comprises a plurality of bits TOUTj[0] through TOUTj[k].

Each of output units 410 comprises a local latch circuit (LOCAL LAT) 412 and a local decoder (LOCAL DEC) 411. Each local latch circuit 412 latches a bit of global output signal GOUT[k:0] in response to second latch signal LATSET2, and outputs a corresponding bit of trim output signals TOUTj[k:0]. Each local decoder 411 controls a latch operation of a corresponding local latch circuit 412 based on address signal ADD. Because each local decoder 411 activates an corresponding local latch circuit 412 in response to address signal ADD, local latch unit 400a sequentially generates trim output signals TOUT1[k:0] through TOUTn[k:0] by selectively changing address signal ADD.

As an example, during a first cycle of the first through third latch operations, local latch unit 400a generates first trim output signal TOUT1[k:0] in response to second latch signal LATSET2 where a current address signal ADD is assigned to a first local latch circuit 412. During a second cycle of the latch operations, local latch unit 400a generates the first trim output signal TOUT2[k:0] in response to second latch signal LATSET2 where address signal ADD corresponds to a second local latch circuit 412. Local latch unit 400a generates trim output signals TOUT1[k:0] through TOUTn[k:0] using 'n' cycles of the latch operations, sequentially through each of local latch circuits 412.

Each of local latch circuits 412 comprises a plurality of latches that latch respective bits of global output signal GOUT[k:0]. Local latch circuits 412 can have a configuration similar to global latch circuits 220a of FIG. 4.

In some embodiments, trim circuit 10 further comprises an output buffer 420. Output buffer 420 provides sensing code SCODE or calibrated code CCODE to a tester or a memory controller as trim output signal TOUT. An output signal DQ of the output buffer can be used to generate a program code PCODE to modify the trim codes stored in trim code storage unit 100.

Trim circuit 10 comprises global latch circuit 220 and 'n' local latch circuits 412, where 'n' is the same number of trim output signals TOUT1 through TOUTn. Global latch circuit 220 is shared so that one of output units 410 receives global output signal GOUT[k:0] of FIG. 5 based on address signal ADD. Accordingly, because global latch circuit 220 is used in common for calibrating or compensating the trim codes, trim circuits 10 can make relatively efficient use of device area and can improve the integration density of memory devices incorporating trim circuits 10.

Figure 6:
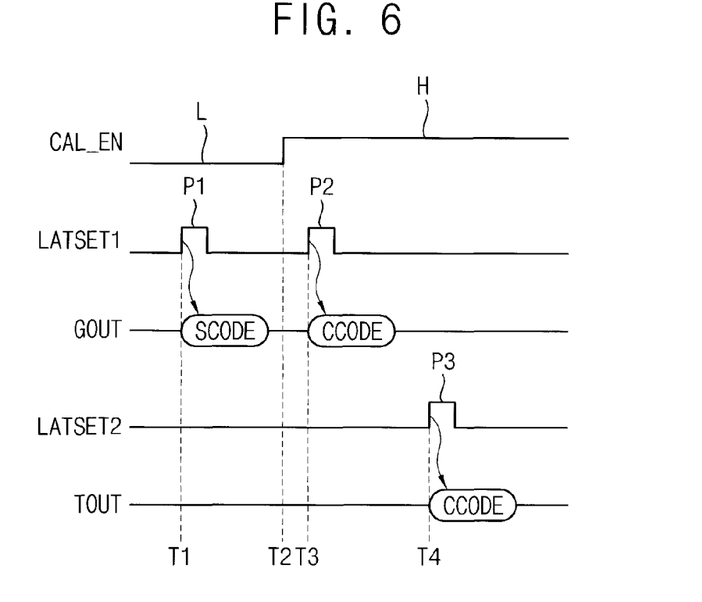
FIG. 6 is a timing diagram illustrating a method of operating a trim circuit according to an embodiment of the inventive concept.
Figure 7:
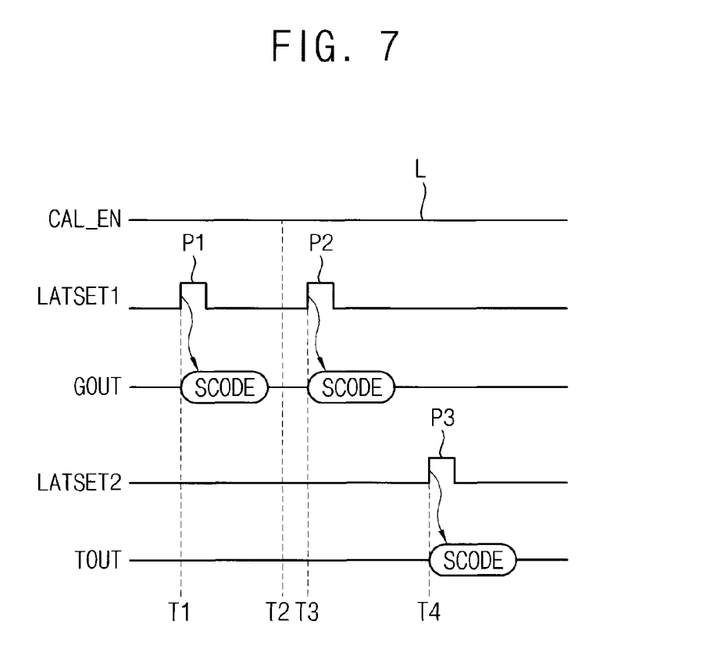
FIG. 7 is a timing diagram illustrating a method of operating a trim circuit according to an embodiment of the inventive concept.

FIG. 6 is a timing diagram illustrating a calibration operation of a trim circuit according to an embodiment of the inventive concept, and FIG. 7 is a timing diagram illustrating a non-calibration operation of a trim circuit according to an embodiment of the inventive concept.

The calibration operation calibrates sensing code SCODE to generate calibrated code CCODE and outputs calibrated code CCODE as trim output signal TOUT. The non-calibration operation outputs sensing code SCODE as trim output signal TOUT without calibrating sensing code SCODE read from trim code storage unit 100.

Referring to FIGS. 6 and 7, first latch signal LATSET1 comprises a first pulse P1 and a second pulse P2 that are sequentially activated. Second latch signal LATSET2 comprises a third pulse P3 that is activated at a time point T4 after first pulse P1 and second pulse P2 are activated.

Global latch unit 200 sequentially performs the first latch operation and the second latch operation. During the first latch operation, global latch unit 200 latches sensing code SCODE and outputs the latched sensing code SCODE as global output signal GOUT. During the second latch operation, global latch unit 200 latches selectively sensing code SCODE or calibrated code CCODE, and outputs the latched code as global output signal GOUT.

In the first latch operation, calibration signal CAL_EN is deactivated to a first logic level (e.g., a logic low level 'L'). In response to the deactivation of calibration signal CAL_EN, global latch unit 200 outputs sensing code SCODE as global output signal GOUT in synchronization with first pulse P1. Sensing code SCODE that is output from global unit 200 as a result of the first latch operation is provided to calculator 300 for use in calculating calibrated code CCODE.

Before the second latch operation is performed in synchronization with second pulse P2, calibration signal CAL_EN is selectively activated to a second logic level (e.g., a logic high level 'H') at a time point T2 based on whether the calibration operation is performed on sensing code SCODE.

As illustrated in FIG. 6, in the calibration operation, calibration enable signal CAL_EN is activated to the second logic level at time point T2, and selection unit 210 selects and outputs calibrated code CCODE in response to activated calibration signal CAL_EN. Global latch circuit 220 performs the second latch operation in synchronization with second pulse P2 and outputs calibrated code CCODE as global output signal GOUT.

As illustrated in FIG. 7, in the non-calibration operation, calibration enable signal CAL_EN remains deactivated after time point T2. Selection unit 210 selects and outputs sensing code SCODE in response to deactivated calibration signal CAL_EN. Global latch circuit 220 performs the second latch operation in synchronization with second pulse P2 and outputs sensing code SCODE as global output signal GOUT.

Local latch unit 400 performs the third latch operation in synchronization with third pulse P3 that is activated at time point T4. Local latch unit 400 latches sensing code SCODE or calibrated CCODE using local latch circuit 412 corresponding to address signal ADD, and generates trim output signal TOUT corresponding to address signal ADD.

In some embodiments, second pulse P2 of first latch signal LATSET1 is omitted where a plurality of non-calibration operations are performed for the plurality of trim output signals TOUT1 through TOUTn. In other words, the second pulse is not generated where sensing code SCODE from trim code storage unit 100 is output as trim output signal TOUT without calibration. In this case, global latch unit 200 performs a single latch operation synchronized to first pulse P1, for outputting each of trim output signals TOUT.

Accordingly, trim circuit 10 can adapt a semiconductor device for various operation modes and/or conditions by calibrating output codes of fuse array 110 (i.e., sensing code SCODE) without changing the trim codes stored in fuse array 110.

Figure 8:
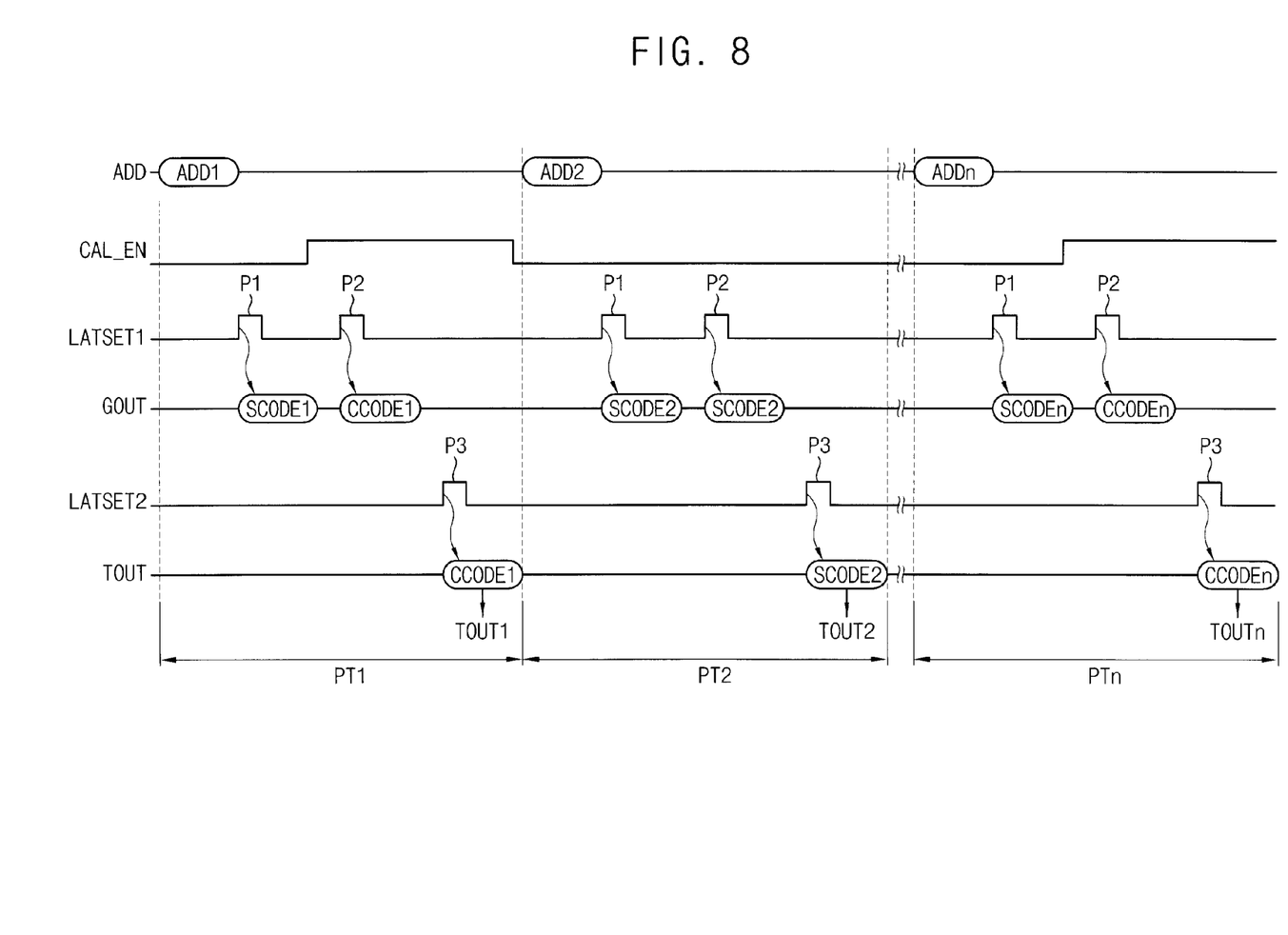
FIG. 8 is a timing diagram illustrating a method of operating a trim circuit according to an embodiment of the inventive concept.

FIG. 8 is a timing diagram illustrating sequential operations of a trim circuit according to an embodiment of the inventive concept.

Referring to FIG. 8, during a first period PT1 where address signal ADD comprises a first address signal ADD1, trim circuit 10 generates first trim output signal TOUT1 corresponding to first address signal ADD1. During a second period PT2 where address signal ADD comprises a second address signal ADD2, trim circuit 10 generates second trim output signal TOUT2 corresponding to second address signal ADD2. Similarly, during an n-th period PTn where address signal ADD indicates the n-th address signal ADDn, trim circuit 10 generates n-th trim output signal TOUTn based on the n-th trim code (i.e., the n-th sensing code SCODEn) corresponding to n-th address signal ADDn.

During each of periods PT1 through PTn, first latch signal LATSET1 comprises first pulse P1 and second pulse P2, and second latch signal LATSET2 comprises third pulse P3. Global latch unit 200 sequentially performs the first latch operation in synchronization with first pulse P1 and performs the second latch operation in synchronization with second pulse P2 to generate each of trim output signals TOUTj. During the first latch operation, global latch unit 200 outputs sensing codes SCODE1 through SCODEn as global output signal GOUT. During the second latch operation, global latch unit 200 selectively outputs sensing codes SCODE1 through SCODEn or calibrated codes CCODE1 through CCODEn, respectively, as global output signal GOUT.

Local latch unit 400 activates local latch circuits 412 that correspond to respective address signals ADD1 through ADDn, and the activated local latch circuits 412 perform the third latch operation to latch global output signal GOUT in synchronization with third pulse P3.

FIG. 8 illustrates an example of latch operations during several periods PT1, PT2 and PTn, where the calibration operation is performed during periods PT1, PTn, and the non-calibration operation is performed during period PT2. In this example, first trim output signal TOUT1 and n-th trim output signal TOUTn represent respective calibrated codes CCODE1 and CCODEn, and second trim output signal TOUT2 represents second sensing code SCODE2.

The calibration and non-calibration operations are controlled based on calibration enable signal CAL_EN. In the calibration operation, calibration enable signal CAL_EN is activated before second pulse P2 is activated. In the non-calibration operation, calibration enable signal CAL_EN remains deactivated where second pulse P2 is activated.

Because global latch circuit 200 is shared for generating trim output signals TOUT1 through TOUTn, trim circuit 10 can make relatively efficient use of device area, can improve the integration density of a semiconductor memory device incorporating trim circuit 10, and can perform a calibration or non-calibration operation on output codes of fuse array 110 with relative efficiency.

Figure 9:
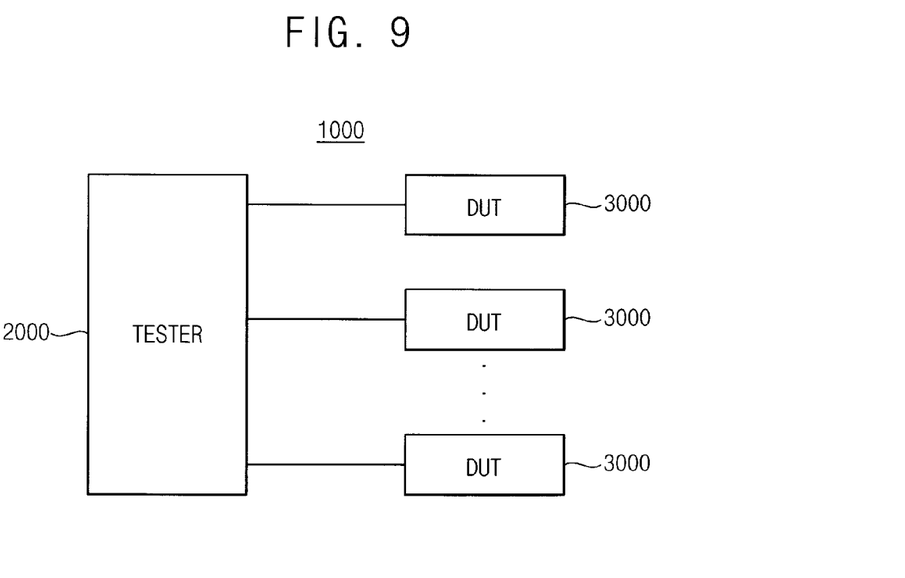
FIG. 9 is a block diagram illustrating a test system according to an embodiment of the inventive concept.

FIG. 9 is a block diagram illustrating a test system according to an embodiment of the inventive concept.

Referring to FIG. 9, a test system 1000 comprises a plurality of devices under test (DUT) 3000 and a tester 2000. Tester 2000 performs parallel tests on devices under test 3000.

Each of devices under test 3000 comprises a trim circuit 10 and a peripheral circuit. The peripheral circuit generates at least one operating voltage and at least one clock signal for driving the memory core, and controls at least one of the clock signal and the operating voltage based on trim output signals TOUT.

As described with reference to FIG. 1, trim circuit 10 comprises trim code storage unit 100, global latch unit 200 and local latch unit 400. Trim code storage unit 100 stores a plurality of trim codes and provides a sensing code SCODE in response to an address signal ADD. Global latch unit 200 latches calibrated code CCODE or sensing code SCODE to provide global output signal GOUT. Calibrated code CCODE is generated by performing a calibration on sensing code SCODE. Local latch unit 400 sequentially latches global output signals GOUT in response to address signal ADD to generate a plurality of trim output signals TOUT.

A test process generally comprises various test subjects, and thus operating voltages and clock signals for devices under test 3000 are modified to obtain proper results on the respective test subjects. In a conventional test process, a test system reads different trim codes from the respective devices, and calibrates the trim codes for each of the devices under test. However, reading the different trim codes can create a timing inefficiency even in a parallel testing configuration. Moreover, in the conventional test process, the calibration of the trim codes can also create a timing inefficiency. Device under test 2000, however, can avoid some of these shortcomings to improve the timing of calibration operations.

Figure 10:
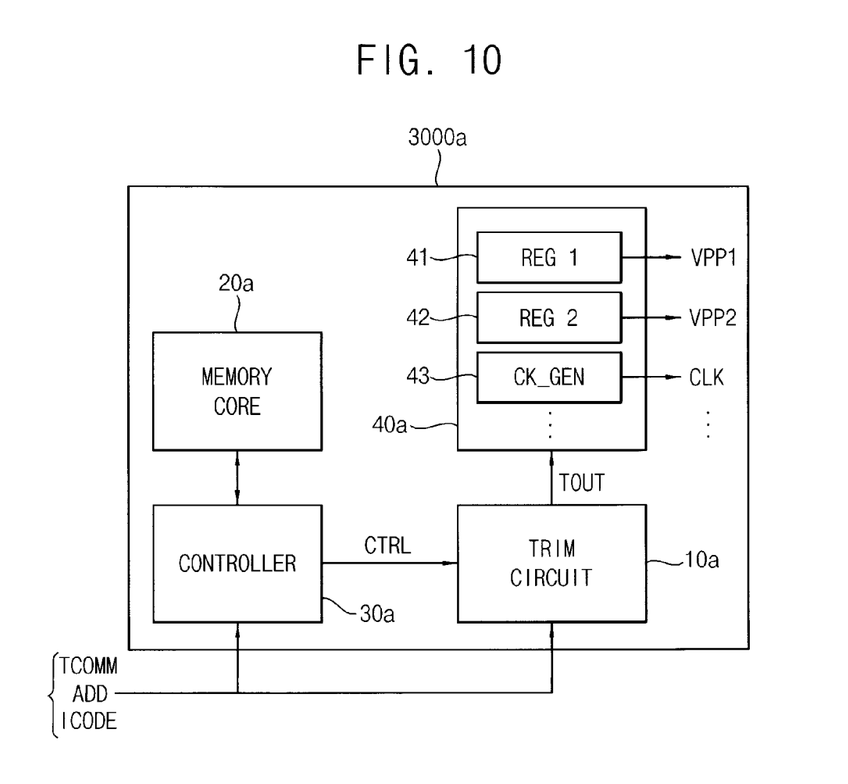
FIG. 10 is a block diagram illustrating a memory device according to an embodiment of the inventive concept.
Figure 11:
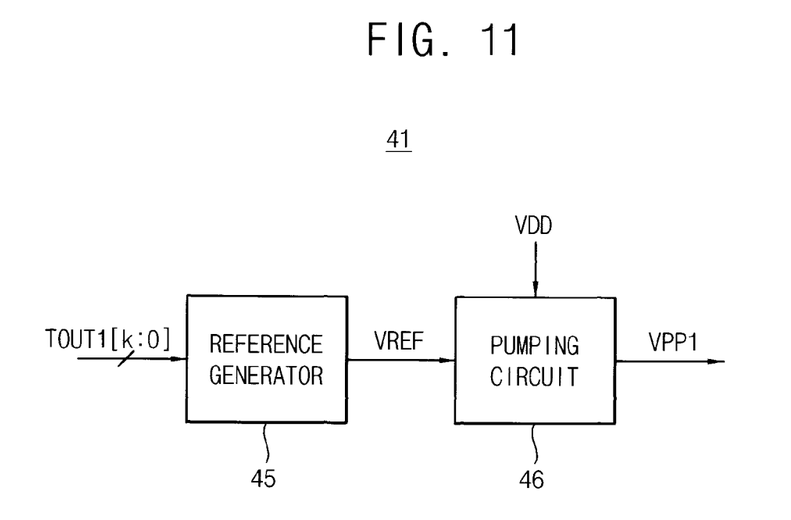
FIG. 11 is a block diagram illustrating an embodiment of a voltage regulator included in the memory device of FIG. 10.

FIG. 10 is a block diagram illustrating a memory device according to an embodiment of the inventive concept, and FIG. 11 is a block diagram illustrating a voltage regulator included in the memory device of FIG. 10.

Referring to FIG. 10, memory device 3000*a* comprises a trim circuit 10*a*, a memory core 20*a*, a controller 30*a*, and a peripheral circuit 40*a*. Memory device 3000*a* of FIG. 10 is a device under test 3000 to be tested by test system 1000 of FIG. 9.

Memory core 20*a* comprises a memory cell array comprising a plurality of memory cells, a decoder for read or write operations on the memory cell array, a sense amplifier, a write driver, etc. Controller 30*a* controls memory core 20 and additionally generates a control signal CNTL for controlling other circuitry such as trim circuit 10*a*.

In some embodiments, a trim control signal TCOMM may be externally provided to controller 30*a* or trim circuit 10*a*. In an example embodiment, trim control signal TCOMM is provided to control 30*a* and the controller generates control signal CNTL based on trim control signal TCOMM. In another embodiment, trim control signal TCOMM is provided to trim circuit 10*a*. In this case trim control signal TCOMM corresponds to control signal CNTL.

Peripheral circuit 40*a* generates at least one operating voltage VPP1 and VPP2 and at least one clock signal CLK for driving memory core 20*a*, and controls at least one of clock signal CLK and operating voltages VPP1 and VPP2 based on trim output signals TOUT. For example, based on trim output signals TOUT, voltage levels and/or generation timings of operating voltages VPP1 and VPP2 are controlled and period widths and/or duty cycles of clock signal CLK are adjusted or changed.

Peripheral circuit 40*a* comprises a first voltage regulator 41 configured to generate first operating voltage VPP1, a second voltage regulator 42 configured to generate second operating voltage VPP2, and a clock generator 43 configured to generate clock signal CLK.

In some embodiments, memory core 20*a* comprises a flash memory core. In such embodiments, operating voltages VPP1 and VPP2 are high voltages generated by pumping a power supply voltage. Flash memory devices generally require high voltages for performing read or write operations. Deviations can occur in the high voltages due to variations in semiconductor manufacturing processes used to form the flash memory devices. Such deviations can have a significant effect on life time or operational stability of the manufactured devices, and therefore the levels of the high voltages are adjusted using trim codes of a fuse array. Moreover, output signals of the fuse array are calibrated according to various operation modes and/or conditions, without changing the stored trim codes of the fuse array. Trim circuit 10*a* calibrate the trim codes to generate trim output signals TOUT, and voltage regulators 41 and 42 trim the levels of high operating voltages VPP1 and VPP2 based on trim output signals TOUT.

Referring to FIG. 11, first voltage regulator 41 comprises a reference voltage generator 45 configured to generate a reference voltage VREF and a pumping circuit 46 configured to pump a power supply voltage VDD to generate a first high operating voltage VPP1 corresponding to reference voltage VREF. First voltage regulator 41 receives a first trim output signal TOUT1[k:0] through reference voltage generator 45. Reference voltage VREF is trimmed based on first trim output signal TOUT1[k:0]. Accordingly, first high operating voltage VPP1 is trimmed based on reference voltage VREF.

The operation modes can be classified based on the respective test subjects or based on the operations of the flash memory such as a program mode, a read-out mode, an erase mode, etc. Additionally, the operation modes can be classified into a single level cell (SLC) mode in which a flash memory cell stores a single bit and a multiple level cell (MLC) mode in which a flash memory cell stores multiple bits. The operating conditions can encompass various operating conditions, such as device temperature, operating frequency, etc.

As described above, trim circuit 10*a* comprises a trim code storage unit 100, global latch unit 200, and local latch unit 400. Trim code storage unit 100 stores a plurality of trim codes. Global latch unit 200 latches calibrated code CCODE or sensing code SCODE to generate global output signal GOUT. Local latch unit 400 sequentially latches global output signal GOUT in response to address signal ADD to generate a plurality of trim output signals TOUT. Trim circuit 10*a* further comprises a calculator 300 configured to perform a calculation on sensing code SCODE and input code ICODE to generate calibrated code CCODE.

Accordingly, trim circuit 10*a* and memory device 3000*a* can be adapted for various operation modes and/or conditions by calibrating output codes of trim code storage unit 100 (i.e., sensing code SCODE) without changing the trim codes stored in trim code storage unit 100.

Figure 12:
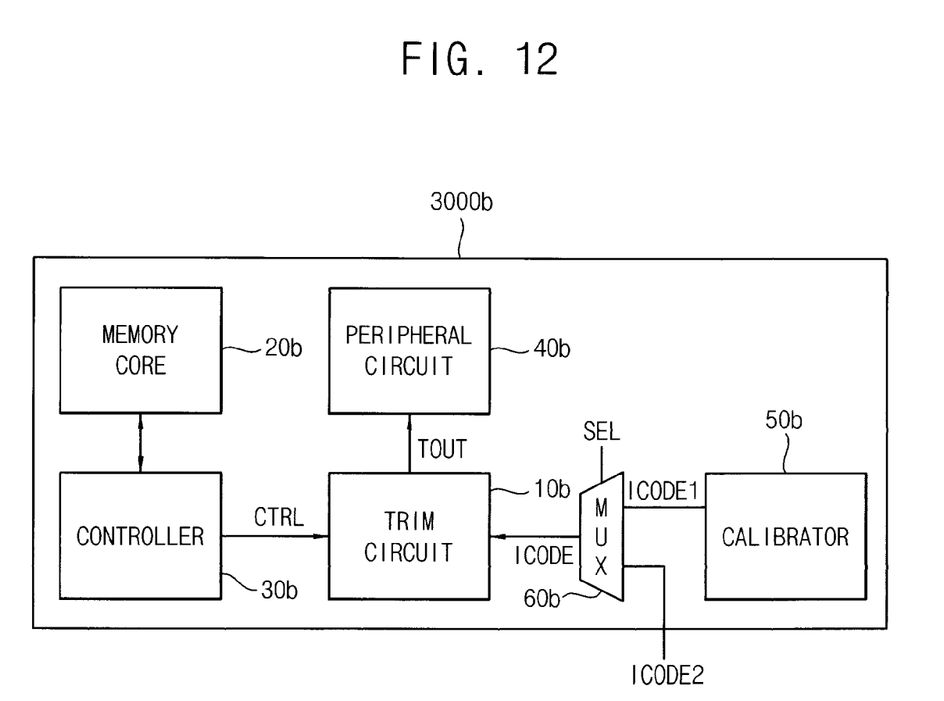
FIG. 12 is a block diagram illustrating a memory device according to an embodiment of the inventive concept.

FIG. 12 is a block diagram illustrating a memory device according to an embodiment of the inventive concept.

Referring to FIG. 12 a memory device 3000b comprises a trim circuit 10b, a memory core 20b, a controller 30b, a peripheral circuit 40b, and a calibrator 50b.

Calibrator 50b generates a first input code ICODE1 for calibrating sensing code SCODE according to operation modes or operation conditions of memory device 3000b. In some embodiments, calibrator 50b comprises a register that stores a plurality of code values for each of the operation modes or conditions. Calibrator 50b outputs corresponding code values as first input code ICODE1. In some other embodiments, calibrator 50b detects the operation modes, the operation conditions and/or output signals of peripheral circuit 40b, and adjusts first input code ICODE1 based on a result of the detection.

Memory device 3000b further comprises a multiplexer 60b that selectively provides first input code ICODE1 or a second input code ICODE2 to the calculator of trim circuit 10b, where second input code ICODE2 may be received from an external device such as a tester. Thus, output signal ICODE of multiplexer 60b is one of first input code ICODE1 and second input code ICODE2. Multiplexer 60b performs multiplexing operations based on a selection signal SEL of control signal CNTL that is generated by controller 30b. During a test operation mode, memory device 3000b calibrates trim codes based on second input code ICODE2 provided from an external device. During a normal operation, memory device 3000b may calibrate based on fits input code ICODE1 provided from multiplexer 60b.

Trim circuit 10b and memory device 3000b can be adapted for various operation modes and/or conditions by calibrating output codes of a fuse array without changing the trim codes stored in the fuse array.

The described embodiments can be employed in different types of devices or systems that store trim codes and calibrate the trim codes for some purposes. Moreover, the described embodiments can be employed in semiconductor devices such as flash memory devices that operate in various operation modes and conditions and trim relatively high operating voltages.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A trim circuit, comprising:
   a trim code storage unit configured to store a plurality of trim codes and to output at least one of the trim codes as a sensing code in response to an address signal;
   a global latch unit configured to latch a calibrated code or the sensing code and to output the latched code as a global output signal, the calibrated code being generated by performing a calibration on the sensing code; and
   a local latch unit configured to repeatedly latch the global output signal in response to the address signal to generate a plurality of trim output signals.

2. The trim circuit of claim 1, further comprising:
   a calculator configured to perform a calculation on the sensing code and an input code to generate the calibrated code, the input code indicating a value for calibrating the sensing code.

3. The trim circuit of claim 2, wherein the global latch unit sequentially performs a first latch operation and a second latch operation to generate each of the trim output signals such that the global latch unit latches the sensing code and outputs the latched sensing code as the global output signal during the first latch operation and the global latch unit selectively latches the sensing code or the calibrated code and outputs the latched code as the global output signal during the second latch operation.

4. The trim circuit of claim 3, wherein the calculator receives the latched sensing code as the global output signal as a result of the first latch operation of the global latch unit.

5. The trim circuit of claim 3, wherein the local latch unit latches the global output signal as a result of the second latch operation of the global latch unit.

6. The trim circuit of claim 1, wherein the global latch unit comprises:
   a selection unit configured to selectively output the sensing code or the calibrated code as an output signal in response to a calibration enable signal; and
   a global latch circuit configured to latch the output signal of the selection unit in response to a first latch signal and configured to output the latched output signal as the global output signal.

7. The trim circuit of claim 6, wherein the global latch unit sequentially performs a first latch operation and a second latch operation to generate each of the trim output signals such that the global latch unit latches the sensing code and outputs the latched sensing code as the global output signal during the first latch operation and the global latch unit selectively latches the sensing code or the calibrated code and outputs the latched code as the global output signal during the second latch operation.

8. The trim circuit of claim 7, wherein the first latch signal comprises a first pulse and a second pulse that are sequentially activated, wherein the first latch operation is performed in synchronization with the first pulse and the second latch operation is performed in synchronization with the second pulse.

9. The trim circuit of claim 7, wherein the calibration enable signal is deactivated during the first latch operation, and the calibration enable signal is selectively activated or deactivated during the second latch operation.

10. The trim circuit of claim 6, wherein the selection unit comprises a plurality of multiplexers that receive respective bits of the sensing code and respective bits of the calibrated code, and
   wherein the global latch circuit comprises a plurality of latches each latching an output signal of a corresponding one of the multiplexers to generate a bit of the global output signal.

11. The trim circuit of claim 1, wherein the local latch unit comprises a plurality of output units configured to sequentially latch the global output signal to generate the respective trim output signals.

12. The trim circuit of claim 11, wherein each of the output units comprises:
   a local latch circuit configured to latch the global output signal in response to a second latch signal to generate the trim output signals; and
   a local decoder configured to control a latch operation of the local latch circuit in response to the address signal.

13. The trim circuit of claim 12, wherein the local latch circuit comprises a plurality of latches configured to latch respective bits of the global output signal.

14. The trim circuit of claim 1, wherein the trim code storage unit comprises a fuse array comprising flash memory cells.

15. A memory device, comprising:
   a memory core configured to store data;
   a trim code storage unit configured to store a plurality of trim codes and to output at least one of the trim codes as a sensing code in response to an address signal;
   a global latch unit configured to latch a calibrated code or the sensing code to generate a global output signal, the calibrated code being generated by performing a calibration on the sensing code;
   a local latch unit configured to repeatedly latch the global output signal in response to the address signal to generate a plurality of trim output signals;
   a peripheral circuit configured to generate at least one operating voltage and at least one clock signal for driving the memory core and further configured to control at least one of the clock signal and the operating voltage based on the trim output signals; and
   a controller configured to control the memory core.

16. The memory device of claim 15, further comprising:
   a calculator configured to perform a calculation on the sensing code and an input code to generate the calibration code, the input code indicating a value for calibrating the sensing code.

17. The memory device of claim 16, further comprising:
   a calibrator configured to generate a first input code for calibrating the sensing code according to an operating mode or operating condition of the memory device.

18. The memory device of claim 17, further comprising:
   a multiplexer configured to selectively output the first input code or a second input code to the calculator, the second input code being received from an external source.

19. The memory device of claim 15, wherein the memory core is a flash memory core, and
   wherein the peripheral circuit comprises at least one voltage regulator configured to pump a power supply voltage to generate operating voltages of the memory core and configured to trim the operating voltages based on the trim output signals.

20. A test system comprising:
   a plurality of devices under test; and
   a tester configured to perform parallel tests on the devices under test, each of the devices under test comprising:
   a trim code storage unit configured to store a plurality of trim codes and configured to output one or more of the trim codes as a sensing code in response to an address signal;
   a global latch unit configured to latch a calibrated code or the sensing code to generate a global output signal, the calibrated code being generated by performing a calibration on the sensing code;
   a local latch unit configured to repeatedly latch the global output signal in response to the address signal to generate a plurality of trim output signals; and
   a peripheral circuit configured to generate at least one operating voltage and at least one clock signal for driving the memory core, and configured to control at least one of the clock signal and the operating voltage based on the trim output signals.

* * * * *